United States Patent [19]
Melnyk et al.

[11] Patent Number: 5,167,984
[45] Date of Patent: Dec. 1, 1992

[54] VACUUM DEPOSITION PROCESS

[75] Inventors: Andrew R. Melnyk, Rochester; Michael G. Swales, Sodus; Donald Teney, Rochester, all of N.Y.

[73] Assignee: Xerox Corporation, Stamford, Conn.

[21] Appl. No.: 624,804

[22] Filed: Dec. 6, 1990

[51] Int. Cl.$^5$ .............................................. B05D 3/14
[52] U.S. Cl. ................... 427/593; 427/248.1; 427/250; 427/255.5; 427/255.6; 427/294
[58] Field of Search .................. 427/50, 248.1, 294, 427/132, 255.5, 255.6, 250

[56] References Cited

U.S. PATENT DOCUMENTS

| | | | |
|---|---|---|---|
| 3,582,611 | 6/1971 | Matheson et al. | 219/271 |
| 3,637,980 | 1/1972 | Fox et al. | 219/271 |
| 3,748,090 | 7/1973 | Cuffini et al. | 432/263 |
| 3,845,739 | 11/1974 | Erhart et al. | 118/49.1 |
| 3,861,353 | 1/1976 | Erhart et al. | 118/49.1 |
| 4,343,834 | 8/1982 | Saito et al. | 427/132 |
| 4,842,973 | 6/1989 | Badesha et al. | 430/128 |

FOREIGN PATENT DOCUMENTS 2211516A 7/1989 United Kingdom .

OTHER PUBLICATIONS

Patent Abstracts of Japan, vol. 9, No. 66, Mar. 26, 1985.
Patent Abstracts of Japan, vol. 9, No. 71, Mar. 30, 1985.

*Primary Examiner*—Bernard Pianalto
*Attorney, Agent, or Firm*—Peter H. Kondo

[57] ABSTRACT

A vacuum evaporation container including a resistively heatable cylindrical crucible having at least one open end and having an axially aligned slot and a hollow cylindrical insert concentrically located within the cylindrical crucible, the insert having a slot aligned with the slot of the crucible, closed ends and an electrical conductivity less than the electrical conductivity of the electrically conductive cylindrical crucible. This vacuum evaporation container is employed in a vacuum deposition process.

14 Claims, 1 Drawing Sheet

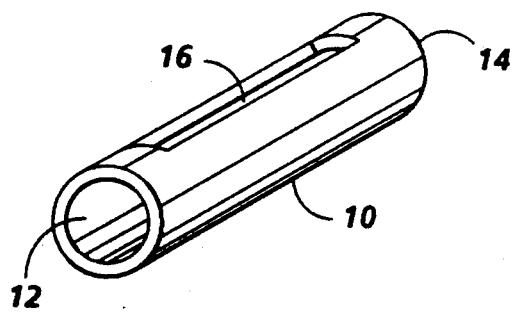
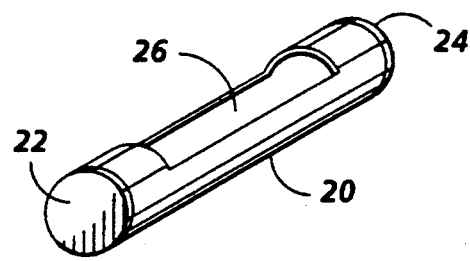
FIG. 1A   FIG. 1B
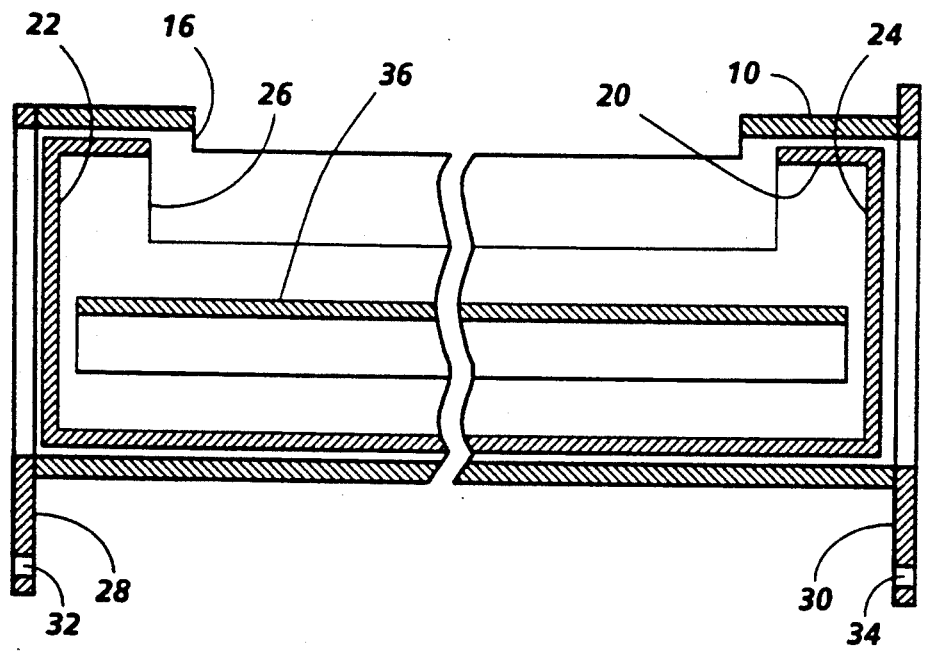
FIG. 2

VACUUM DEPOSITION PROCESS

BACKGROUND OF THE INVENTION

This invention relates in general to a vacuum evaporation system and more specifically, to apparatus and processes for vacuum evaporating vaporizable materials.

In the art of electrophotography an electrophotographic plate comprising a photoconductive layer on a conductive layer is imaged by first uniformly electrostatically charging the imaging surface of the photoconductive layer. The plate is then exposed to a pattern of activating electromagnetic radiation such as light, which selectively dissipates the charge in the illuminated areas of the photoconductive layer while leaving behind an electrostatic latent image in the non-illuminated area. This electrostatic latent image may then be developed to form a visible image by depositing finely divided electroscopic toner particles on the surface of the photoconductive layer. The resulting visible toner image can be transferred to a suitable receiving member such as paper. This imaging process may be repeated many times with reusable photoconductive layers. Numerous different types of electrophotographic imaging members for xerography, i.e. photoreceptors, can be used in the electrophotographic imaging process. Such electrophotographic imaging members may include inorganic materials, organic materials, and mixtures thereof. Electrophotographic imaging members may comprise contiguous layers in which at least one of the layers performs a charge generation function and another layer forms a charge carrier transport function or may comprise a single layer which performs both the generation and transport functions. The electrophotographic plate may be in the form of a plate, drum, flexible photoreceptor web, sheet, flexible belt and the like.

The photoconductive layer or layers may be formed of various materials. If the photoconductive materials are vaporizable and do not decompose at vaporizing temperatures, they can often be deposited by vacuum deposition. Similarly, vaporizable materials may be vacuum deposited for various other applications such as solar cells, metallic layers for decorative packaging, capacitors, optical coatings on glass and the like.

Electrophotographic imaging members based on amorphous selenium have been modified to improve panchromatic response, increase speed and to improve color copyability. These devices are typically based on alloys of selenium with tellurium and/or arsenic. These selenium electrophotographic imaging members may be fabricated as single layer devices comprising a selenium-tellurium, selenium-arsenic or selenium-tellurium-arsenic alloy layer which performs both charge generation and charge transport functions. The selenium electrophotographic imaging members may also comprise multiple layers such as, for example, a selenium alloy transport layer and a contiguous selenium alloy generator layer.

A common technique for manufacturing photoreceptor plates involves vacuum deposition of a selenium alloy to form an electrophotographic imaging layer on a substrate. Tellurium is incorporated as an additive for the purpose of enhancing the spectral sensitivity of the photoconductor. Arsenic is incorporated as an additive for the purpose of improving wear characteristics, passivating against crystallization and improving electrical properties. Typically, the tellurium addition is incorporated as a thin selenium-tellurium alloy layer deposited over a selenium alloy base layer in order to achieve the benefits of the photogeneration characteristics of SeTe with the beneficial transport characteristics of SeAs alloys. Fractionation of the tellurium and/or arsenic composition during evaporation results in a concentration gradient in the deposited selenium alloy layer during vacuum evaporation. Thus, the term "fractionation" is used to describe inhomogeneities in the stoichiometry of vacuum deposited alloy thin films. Fractionation occurs as a result of differences in the partial vapor pressure of the molecular species present over the solid and liquid phases of binary, ternary and other multicomponent alloys. Alloy fractionation is a generic problem with chalcogenide alloys. A key element in the fabrication of doped photoreceptors is the control of fractionation of alloy components such as tellurium and/or arsenic during the evaporation of selenium alloy layers. Tellurium and/or arsenic fractionation control is particularly important because the local tellurium and/or arsenic concentration at the extreme top surface of the structure, denoted as top surface tellurium (TST) or top surface arsenic (TSA), directly affects xerographic sensitivity, charge acceptance, dark discharge, copy quality, photoreceptor wear and crystallization resistance. In single layer low arsenic selenium alloy photoreceptors, arsenic enrichment at the top surface due to fractionation can also cause severe reticulation of the evaporated film. In two layer or multilayer photoreceptors where low arsenic alloys may be incorporated as a base or transport layer, arsenic enrichment at the interface with the layer above can lead to severe residual cycle up problems. In single layer tellurium selenium alloy photoreceptors, tellurium enrichment at the top surface due to fractionation can cause undue sensitivity enhancement, poor charge acceptance and enhancement of dark discharge. In two layer or multilayer photoreceptors where tellurium alloys may be incorporated as a generator layer, tellurium enrichment at the upper surface of the tellurium alloy layer can result in similar undue sensitivity enhancement, poor charge acceptance, and enhancement of dark discharge.

Another common technique for manufacturing photoreceptors involves vacuum deposition of organic and inorganic pigments to form a thin charge generation layer. This charge generation layer together with a thicker charge transport layer form an electrophotographic imaging layer on a substrate. A typical thickness of the charge generation layer is between about 0.05 micrometer and about 1 micrometer with about 0.1 micrometer to about 0.5 micrometer being preferred. The pigment material may comprise a selenum-tellurium alloy with a high concentration of tellurium for red sensitivity or may comprise an organic pigment such as phthalocyanine, perylene, or other polycyclic pigment that is thermally stable. These organic pigments sublime when heated in the vacuum to temperatures above about 400° C. Because they do not melt and make good thermal contact with the crucible, it is preferable that they are vacuum deposited out of an isothermal source. Furthermore, while these pigments are stable at elevated temperatures in an inert container in a vacuum in the presence of metals and other impurities they may decompose or react partially. Thus, it is preferable that the evaporation source be made out of an inert materials such as quartz.

Two types of techniques are used in thermal evaporation and vacuum deposition of materials. Free evaporation directly from solid surfaces (sometimes referred to as Langmuir evaporation), is approximated by shallow open crucible sources and is the most commonly used technique. This type of free evaporation from open crucible sources promote fractionation of multi-component evaporant materials such as mixtures of selenium with arsenic and/or tellurium. In the other technique, called Knudsen's method, evaporation occurs as effusion from an isothermal enclosure or crucible with a small orifice. The evaporation surface inside the enclosure is large compared with the size of the orifice and maintains an equilibrium pressure inside. The enclosed Knudsen type of source has two advantages: the enclosed source eliminates spatter due to localized vaporization by poorly conducting materials and gives a greater latitude in choosing temperature and pressure conditions that will permit a multicomponent material to be in equilibrium and evaporate congruently. When a multicomponent material is in equilibrium and evaporates congruently, the composition of the deposited coating is constant with time. Many vaporizable materials such as, for example, alloys of selenium, arsenic and/or tellurium can be evaporated congruently under the appropriate conditions. Tube crucibles with a constricted slit approximate a Knudsen cell and facilitate attainment of equilibrium and congruent evaporation of multicomponent materials. The geometry of a tube crucible having a constricted slit also permits easy fabrication and uniform heating by resistance with no cold or hot spots.

Although excellent deposits may be achieved with tube crucibles having constricted slits or slots, loading of evaporants through the narrow slot opening is difficult, slow, tedious, and sometimes, impossible because of the relative size of the particles being loaded and the width of the slot in the Knudsen-type crucible. If the slit opening is widened to facilitate loading of the crucible, the performance of the crucible approaches that of an open crucible. On the other hand, abandonment of the simple tube geometry concept to fabricate compound crucibles with a removable cover to allow loading introduces difficulties in maintaining temperature uniformity within the crucible. It also renders loading more complex (particularly in planetary coating devices), difficult, expensive and time consuming. Further, after one or more coating runs, it may be necessary to clean the crucible of residue as the resulting debris can cause defects to occur in subsequently formed photoreceptor layers.

Generally, because of the importance of maintaining a fixed distance between the crucibles and the substrates to be coated, and because of the massive electrical connections utilized between the electrically conductive crucibles and the power source, the crucibles are normally rigidity mounted in position and removal thereof is difficult and time consuming. Moreover, because the crucibles are normally semipermanently mounted in the vacuum chamber, production is delayed for loading of the crucibles with the evaporant and for cleaning. Further, cleaning of the Knudsen-type crucibles is extremely difficult because of the small slot widths.

INFORMATION DISCLOSURE STATEMENT

U.S. Pat. No. 4,842,973 to Badesha et al., issued Jun. 27, 1989,—A process is disclosed for fabricating an electrophotographic imaging member comprising providing in a vacuum chamber at least one first layer crucible, at least one second layer crucible, and a substrate. The substrate may comprise an electrically conductive material such as aluminum, titanium, nickel, stainless steel, and the like. See, for example, column 9, lines 19-22.

U.S. Pat. No. 3,582,611 to Matheson et al., issued Jun. 1, 1971—An apparatus is disclosed for evaporation and vacuum deposition of metal on an article to be coated. A variable resistance evaporation boat 6 has a cavity 7 on its upper surface as shown in FIG. 1. The ends of the boat have a lower resistivity than the center in order to reduce end heat loss.

U.S. Pat. No. 3,637,980 to Fox et al., issued Jan. 25, 1972—An evaporating boat is disclosed in which a trough is shown for receiving materials to be evaporated.

U.S. Pat. No. 3,845,739 issued to Erhart et al on Nov. 5, 1974—A planetary coating system is disclosed for vacuum coating a plurality of substrate bodies.

U.S. Pat. No. 3,861,353 issued to Erhart et al on Jan. 21, 1975—A planetary coating system is disclosed for vacuum coating a plurality of substrate bodies.

Thus, there is a continuing need for an improved system for vacuum evaporating vaporizable materials.

SUMMARY OF THE INVENTION

It is, therefore, an object of the present invention to provide an improved vacuum evaporation containers which facilitate more rapid loading of material to be evaporated.

It is another object of the present invention to provide improved vacuum evaporation containers which are inert with respect to the evaporant.

It is yet another object of the present invention to provide improved vacuum evaporation containers which eliminates the need for frequent connecting and disconnecting of electrical cables.

It is still another object of the present invention to provide improved vacuum evaporation containers which facilitates cleaning offline.

It is another object of the present invention to provide improved vacuum evaporation containers which facilitate rapid change of the type materials to be deposited.

It is yet another object of the present invention to provide improved vacuum evaporation containers which permit the use of disposable evaporation container components.

It is still another object of the present invention to provide improved vacuum evaporation containers which permit the use of harsh materials such as acids or solvents to clean vacuum evaporator containers without adverse effects.

The foregoing objects and others are accomplished in accordance with this invention by providing a vacuum evaporation container comprising a resistively heatable cylindrical crucible having at least one open end and having an axially aligned slot and a hollow cylindrical insert concentrically located within the cylindrical crucible, the insert having a slot aligned with the slot of the crucible, closed ends and an electrical conductivity less than the electrical conductivity of the electrically conductive cylindrical crucible. This invention also includes a vacuum deposition process comprising providing a vacuum evaporation container comprising an electrically conductive cylindrical crucible having at least one open end and having an axially aligned slot and a hollow cylindrical insert concentrically located within the cylindrical crucible, the insert having a slot aligned with the slot of the crucible, closed ends and an electrical conductivity less than the electrical conductivity of the electrically conductive cylindrical crucible, inserting solid vaporizable material into the hollow cylindrical insert, placing a substrate to be coated adjacent to the vacuum evaporation container, and heating the cylindrical crucible in a partial vacuum to vaporize the vaporizable material and depositing the material as a coating on an adjacent substrate.

BRIEF DESCRIPTION OF THE DRAWINGS

A more complete understanding of the present invention can be obtained by reference to the accompanying drawings wherein:

FIG. 1A is an isometric illustration of an open ended cylindrical crucible employed in the system of this invention.

FIG. 1B is an isometric illustration of a closed end cylindrical insert employed in the system of this invention.

FIG. 2 is a schematic cross-sectional view of a closed end cylindrical insert enclosed within an open ended cylindrical crucible employed in the system of this invention.

These figures merely schematically illustrate the invention and are not intended to indicate relative size and dimensions of the device or components thereof.

DETAILED DESCRIPTION OF THE DRAWINGS

Referring to FIG. 1A, a hollow electrically conductive cylindrical

Referring to FIG. 1A, a hollow electrically conductive cylindrical crucible 10 is shown having open ends 12 and 14 and a narrow slit opening 16.

In FIG. 1B, a hollow cylindrical boat insert 20 is illustrated having closed ends 22 and 24 and a wide slit opening 26. This wide slit opening facilitates rapid and clean loading of evaporant into the hollow cylindrical boat insert 20.

Referring to FIG. 2, hollow cylindrical boat insert 20 is concentrically located within cylindrical crucible 10 with wide slit opening 26 aligned with narrow slit opening 16. Electrically conductive flanges 28 and 30, welded to each end of cylindrical crucible 10, contain holes 32 and 34 adapted to receive bolts (not shown) which secure power cables (not shown) to the flanges. The flanges are also provide support for the crucible and can be fastened by any suitable means to frame members of any suitable and conventional vacuum coating housing (not shown). An optional baffle 36 may positioned between the ends 22 and 24 of insert 20 and above the evaporant (not shown) to prevent line of sight exit of evaporated material through opening 16, but still allow easy loading as well as egress of vapors. The baffle may be of any suitable shape. Typical cross-sectional shapes include flat, inverted square "U", inverted semicircle, and the like. Generally, hollow cylindrical boat insert 20 is as long as the coating widths required for each substrate to be coated. The narrow slit opening 16 of crucible 10 is preferably positioned parallel to the surface to be coated. Where the surface to be coated is the outer surface of drums, the axis of the drums are preferably positioned parallel to the axis of hollow electrically conductive cylindrical crucible 10. Similarly, the axis of rollers supporting web material to be coated are also preferably positioned parallel to the axis of hollow electrically conductive cylindrical crucible 10.

If desired, hollow electrically conductive cylindrical crucible 10 may be relatively long and enclose a plurality of relatively short cylindrical boat inserts 20. Where drums are supported on mandrels parallel to and spaced from the long hollow crucible, the length of individual cylindrical boat inserts would normally be as long as the coating widths required for each drum. Similarly, where multiple segment strips across the width of wide belts are to be coated (the belt being subsequently sliced lengthwise to separate it into segment strips), the length of individual cylindrical boat inserts would normally be as long as the coating widths required for each segment strip. Although a space between the outer surface of cylindrical insert 20 and hollow electrically conductive cylindrical crucible 10 is shown in FIG. 2, any such space is preferably eliminated or at least minimized in order to maximize heat transfer between the outer surface of cylindrical insert 20 and hollow electrically conductive cylindrical crucible 10. The cylindrical insert 20 and hollow electrically conductive cylindrical crucible 10 combination may be used as a vacuum evaporation container in any suitable and conventional vacuum coating apparatus such as a planetary coater, an in-line coater, a web coater, coaters with stationary substrates, and the like. Typical planetary coaters are described in U.S. Pat. Nos. 3,861,353 and 3,845,739, the entire disclosures thereof being incorporated herein by reference.

In operation, hollow boat cylindrical insert 20 is loaded with evaporant through wide slit opening 26. The hollow boat cylindrical insert 20 can be preloaded while a coating run is being made with another previously loaded hollow boat cylindrical insert 20 thereby minimizing the time expended to remove the empty inserts, cleaning the insert (if necessary), loading the insert with evaporant, and reinstalling the insert in the crucible. When the previous coating run is completed, the empty hollow boat cylindrical insert 20 may be slid out from either open end 12 or 14 of hollow electrically conductive cylindrical crucible 10 and the preloaded insert slid into either open end 12 or 14 of crucible 10. If desired, the preloaded insert may be pushed into one open end of crucible 10 to force out the empty inserts from the other open end of crucible 10. After sliding preloaded insert 20 into crucible 10 and positioning a substrate to be coated adjacent to crucible 10, a suitable partial vacuum is applied to a chamber housing crucible 10 and the substrate to be coated (not shown). Sufficient electric current is supplied to flanges 28 and 30 to heat crucible 10 and insert 20 and evaporate the evaporant.

The crucible is heatable by electrical resistance heating. Any suitable electrically conductive heat resistant material may be utilized for the crucible. Generally, the resistance heatable crucibles have a resistance range of between about $10^{-2}$ ohms and about $10^3$ ohms. Typical electrically conductive heat resistant material include stainless steel, tantalum, tungsten, molybdenum, Hastelloy TM, and the like. The specific resistivity selected depends upon the electrical power supply utilized. Any suitable means such as flanges fastened to the crucibles may be utilized to facilitate attachment of electrical connections. The flanges may have holes drilled therethrough to allow electrical terminals to be bolted thereon. The crucibles walls should be sufficiently thick to allow the crucible to be self supporting and resistant to distortion or warping during use at elevated temperatures. Typical wall thicknesses are from about 0.25 millimeter to about 1 millimeter. Thin walls are preferred to achieve high electrical resistance.

The cross-section of the interior of the crucible may be of any suitable shape. Typical shapes include circles, ovals, squares, rectangles, triangles, pentagons, hexagons, octagons, and the like. The length of the crucible is preferably longer than the width of the substrate to be coated.

The inner cross-sectional area selected for the crucible depends upon the intended use of the crucible. Thus, for example, when small amounts of evaporant is to be deposited, the inner cross-sectional area of the crucible should be correspondingly small. A typical inner cross-sectional areas for a crucible to be used to form selenium alloy coating having a thickness of about 50 micrometers on six cylindrical metal substrates having a circumference of about 200 centimeters is about 192 square centimeters. A typical inner cross-sectional area for a crucible to be used to form a charge generator layer having a thickness of about 0.2 micrometer on a web about 2 kilometers long is about 128 cm$^2$. In the above, it was assumed that the packing density of the evaporant was about 25 percent, the coating efficiency was about 50 percent and less than about 25 percent of the crucible volume was filled.

The maximum size of the width of the crucible slot depends upon the interior volume of the crucible, the rate of the material to be deposited and the positive pressure to be achieved within the crucible during deposition. Thus, the smaller the internal volume of the crucible, the smaller the slot width to ensure that sufficient pressure is achieved during evaporation so that the evaporated material flows substantially uniformly through the narrow slot to the substrate to be coated. Depending upon the interior volume of the crucible, the slot width may vary from between about 5 millimeters and about 50 millimeters. The minimum width of the slot is determined by the need to avoid plugging of the slot during vacuum deposition of the coating. Generally, the ratio of the slot width to the interior cross-sectional area of the crucible ranges from between about 1:100 and about 1:5. A typical example of a crucible slot width to interior cross-sectional area for vacuum deposition of a material comprising organic pigment is a crucible having a slot width of about 13 millimeters and an interior cross-sectional area of about 71 square centimeters. Generally, the length of the crucible slot is slightly longer than the width of the area to be coated. Where the length of the crucible extends across the widths of multiple substrates, the slot may optionally contain transverse struts which enhance rigidity of the crucible and which function as masks to prevent deposition of evaporant adjacent the edges of each substrate being coated.

The crucible utilized for this invention may be rigidly mounted in the vacuum deposition apparatus to ensure proper alignment with the substrate to be coated. The crucible need not be moved from the coating housing from one coating operation to another. This eliminates the need for frequent connecting and disconnecting of heavy electrical power cables which could result in changes in electrical resistivity at the point of connection from one coating run to another thereby affecting the quality and quantity of vacuum deposited coating. To permit expansion and contraction of the crucible when heated and cooled, one end may be mounted so that it is free to move on the axis of the crucible.

Any suitable inert heat resistant material having an electrically conductivity less than that of the crucible may be employed in the boat insert. The boat insert may be electrically conductive but, in this case, its resistivity should be taken into account to determine the current needed to heat the crucible. Preferably, the hollow cylindrical insert is sufficiently electrically insulating so that less than about 1 percent of the electrical current flowing from one end of the crucible to the other end passes through the boat insert. The hollow cylindrical insert should be resistant to degradation at high vacuum deposition temperatures and be non-reactive with materials to be vacuum deposited. Typical heat resistant materials having an electrically conductivities less than that of electrically conductive crucibles include quartz glass, graphite, aluminum oxide, silicon carbide, tantalum carbide, ceramic, and the like. Generally, the insert materials do not react with the evaporant material and are unaffected by acids or strong solvents useful for the removal of coating material residue whereas acids or solvents are corrosive to many crucible materials. If desired, the inserts may be disposable.

The insert walls should be sufficiently thick to allow the insert to be self supporting and resistant distortion or warping during use at elevated temperature. Typical insert wall thicknesses are from about 1 millimeter and about 10 millimeters. Generally, the ends of the crucibles are aligned with areas of the drum webs that are to be free of uncoated material. Thus, each end of an insert is preferably aligned with the corresponding edge of a substrate that is to remain uncoated. The length of the insert may be longer than, the same as, or shorter than the length of the crucible. A plurality of inserts may be inserted into a single crucible. Preferably, the insert has a length (combined length where multiple inserts are involved) shorter than the length of the crucible so that the insert or inserts can be more centrally positioned in the crucible where heating is more uniform. Inserts of various different lengths may be utilized in the same crucible. Thus, a permanently mounted crucible can be used to apply coatings of different widths thereby accommodating different substrates having different widths either during the same coating run or in sequential runs. Preferably, the end walls of the inserts should be shaped to substantially close each open end of the crucible. Such closures serve to maintain pressure within the crucible.

The width of the slot employed for the insert may be quite large and, for example, equal the diameter of an insert having a circular cross-section. The length of the slot in the insert may be as small as the width of the slot for large volume crucibles where the crucible slot is wide enough to facilitate easy loading of the crucible with the specific material to be vacuum deposited. However, if the width of the slot of the crucible is too small for convenient loading of the material to be evaporated, the width of the slot of the insert should be larger than the slot of the crucible and be of sufficient width to facilitate easy loading of the material to be vacuum deposited. Also, the width of the insert slot should be larger than the largest particle size of the material to be vacuum deposited even though the width of the crucible slot is smaller than the largest particle size of the material to be vacuum deposited. Typical slot widths are between about 2.5 centimeters and about 25 centimeters. In typical evaporation runs for depositing alloys, alloys of Arsenic and selenium could be vacuum evaporated congruently, that is, the composition of the deposit could be maintained constant with time by employing narrow crucible openings of less than 10 millimeter and preferable less than 5 millimeter for a 50 millimeter diameter crucible.

Generally, it is preferred that the cylindrical insert fit snugly in the interior of the crucible to maximize transfer of heat energy from the crucible to the insert and prevent vapors from exiting out the ends. Thus, it is preferred that the external cross-sectional shape of the insert have the same shape as the cross-sectional shape of the crucible. This ensures that the external surface of the insert will be substantially paralleled to the adjacent interior surface of the crucible in a direction axial of both the insert and crucible.

If desired, one or more baffles may be mounted within the interior of the insert to block any line of sight path between the surface of the material to be vacuum deposited and the slot opening of the crucible. Typical baffles include baffles extending from one end of the insert to the other end, the baffles having a cross-section shape like an inverted "U" with 90° corners. The cross-sectional shape of the baffle may have any other suitable configuration such as flat, arcuate, angular, and the like.

Since matching sets of inserts may be utilized to facilitate loading of one set of inserts with material to be vacuumed deposited while another set of inserts is simultaneously being used in a crucible for a coating operation, loaded inserts can be inserted into crucibles immediately after removal of spent inserts. Moreover, by using one or more extra sets of inserts, some of the sets of inserts may be cleaned while other inserts are being used for loading operations and still other sets of inserts are employed in coating operations. Where the crucibles are open at each end, fresh inserts can be inserted in one end of the crucible thereby pushing the spent inserts out the other end. Alternatively, the spent inserts may be pushed out of one end of a crucible by inserting a push rod into the other end of the crucible and freshly loaded inserts may be inserted into the same end of the crucible from which the spend inserts were removed. Still other loading and unloading procedures are apparent in view of these teachings.

Any suitable material may be vacuum deposited with the evaporation container of this invention. The materials may be organic or inorganic. Typical inorganic materials for vacuum deposition include selenium, selenium arsenic alloys, selenium arsenic tellurium alloys, selenium tellurium alloys, halogen doped selenium alloys, and the like. Photoconductive chalcogenide alloy including binary, tertiary, quaternary, and the like alloys may be employed to form a vacuum deposited photoconductive layer. Typical photoconductive alloys of selenium include selenium-tellurium, selenium-arsenic, selenium-tellurium-arsenic, selenium-tellurium-chlorine, selenium-arsenic-chlorine, selenium-tellurium-arsenic-chlorine alloys, and the like. Preferred photoconductive alloys include alloys of selenium with tellurium, arsenic, or tellurium and arsenic with or without a halogen dopant. As employed herein, a selenium alloy is defined as an intermetallic compound of selenium with other elemental additives where the ratios of constituents are inconsistent with stoichiometric compositions. The photoconductive alloys of selenium may be applied to a coated or uncoated substrate alone as the only photoconductive layer or it may be used in conjunction with one or more other layers such as a selenium or selenium alloy transport layer and/or a protective overcoat layer. Generally, the selenium-tellurium alloy may comprise between about 5 percent by weight and about 40 percent by weight tellurium and a halogen selected from the group consisting of up to about 70 parts per million by weight of chlorine and up to about 140 parts per million by weight of iodine all based on the total weight of the alloy with the remainder being selenium. The selenium-arsenic alloy may, for example, comprise between about 0.01 percent by weight and about 50 percent by weight arsenic and a halogen selected from the group consisting of up to about 200 parts per million by weight of chlorine and up to about 1000 parts per million by weight of iodine all based on the total weight of the alloy with the remainder being selenium. The selenium-tellurium-arsenic alloy may comprise between about 5 percent by weight and about 40 percent by weight tellurium, between about 0.1 percent by weight and about 5 percent by weight arsenic and a halogen selected from the group consisting of up to about 200 parts per million by weight of chlorine and up to about 1000 parts per million by weight of iodine all based on the total weight of the alloy with the remainder being selenium. The expressions "alloy of selenium" and "selenium alloy" are intended to include halogen doped alloys as well as alloys not doped with halogen. When employed as a photoconductive layer in an electrophotographic imaging member, the thickness of the photoconductive selenium alloy layer is generally between about 0.1 micrometer and about 400 micrometers thick.

Selenium-tellurium and selenium-tellurium-arsenic alloy photoconductive layers are frequently employed as a charge generation layer in combination with a charge transport layer. The charge transport layer is usually positioned between a supporting substrate and the charge generating selenium alloy photoconductive layer. Generally, a selenium-tellurium alloy may comprise from about 60 percent by weight to about 95 percent by weight selenium and from about 5 percent by weight to about 40 percent by weight tellurium based on the total weight of the alloy. The selenium-tellurium alloy may also comprise other components such as less than about 35 percent by weight arsenic to minimize crystallization of the selenium and less than about 1000 parts per million by weight halogen. In a preferred embodiment, the photoconductive charge generating selenium alloy layer comprises between about 5 percent by weight and about 25 percent by weight tellurium, between about 0.1 percent by weight and about 4 percent by weight arsenic, and a halogen selected from the group consisting of up to about 100 parts per million by weight of chlorine and up to about 300 parts per million by weight of iodine with the remainder being selenium. Compositions for optimum results are dictated by the application. It is desirable, in general, to achieve uniformly homogeneous compositions within the evaporated layers, i.e. to evaporate the alloy materials without significant fractionation. Elevated levels of tellurium lead to excessive photoreceptor light sensitivity and high dark decay and correspondingly reduced levels of tellurium result in low light sensitivity and loss of copy quality. Elevated levels of arsenic in some applications, above about 4 percent by weight, can lead to high dark decay, to problems in cycling stability and to reticulation of the photoreceptor surface. The resistance of amorphous selenium photoreceptors to thermal crystallization and surface wear begins to degrade as the concentration of arsenic drops below about 1 percent by weight. As the chlorine content rises above about 70 parts per million by weight chlorine, the photoreceptor begins to exhibit excessive dark decay.

The inorganic particles employed in the process of this invention may, in general, be in either shot (bead) particle or pellet particle form. However, the particles may also be in chunk form, if so desired. Generally, to prepare selenium alloy shot (bead) particles, the components of selenium alloys are combined by melting the selenium and additives together by any suitable conventional technique. The molten selenium alloy is then shotted by any suitable method. Shotting is usually effected by quenching molten droplets of the alloy in a coolant such as water to form large particles of alloy in the form of shot or beads. Shotting processes for forming alloy beads are well known and described, for example, in U.S. Pat. No. 4,414,179, the entire disclosure of this patent being incorporated herein by reference. The alloy beads may have an average size of, for example, between about 300 micrometers and about 3,000 micrometers. Pellet particles may be prepared from shot particles by grinding shot particles into a powder and thereafter compressing the powder into relatively large pellets. Pelletizing of the amorphous shotted alloy is frequently utilized as a means of controlling fractionation.

Where selenium alloy pellets are to be employed, the alloy beads, or combination of the alloy beads and minor amount of dust particles may be rapidly ground in a conventional high speed grinder or attritor to form alloy particles having an average particle size of less than about 200 micrometers. Any suitable grinding device may be utilized to pulverize the bead particles to form the fine alloy particles having an average particle size of less than about 200 micrometers. Typical grinders include hammer mills, jet pulverizers, disk mills, and the like. Depending upon the efficiency of the grinding device employed, grinding alloy beads to form alloy particles having an average particle size of less than about 200 micrometers can normally be accomplished in less than about 5 minutes. Longer grinding times may be employed, if desired.

One method of preparing selenium alloys for evaporation is to grind selenium alloy shot (beads) and compress the ground material into pellet agglomerates, typically 150–300 mg. in weight and having an average diameter of about 6 millimeters (6,000 micrometers). The pellets are evaporated from the containers of this invention in a vacuum coater using a time/temperature profile designed to minimize the fractionation of the alloy during evaporation. The pellets may be of any suitable shape. Typical shapes include cylinders, spheres, cubes, tablets, and the like. Compression of the alloy particles into pellets may be accomplished with any suitable device such as, for example, a simple punch tableting press, a multi punch rotary tableting press, and the like.

Typical organic materials for vacuum deposition include phthalocyanines including metal free phthalocyanine described in U.S. Pat. No. 3,357,989, metal phthalocyanines such as vanadyl phthalocyanine and copper phthalocyanine, titanyl phthalocyanine and chloroindium phthalocyanine, dibromoanthanthrone, perylene pigments, Monastral violet and Monastral Red Y, Vat orange 1 and Vat orange 3 trade names for dibromo anthanthrone pigments, benzimidazole perylene, polynuclear aromatic quinones available from Allied Chemical Corporation under the tradename Indofast Double Scarlet, Indofast Violet Lake B, Indofast Brilliant Scarlet and Indofast Orange, and the like. Other suitable vaporizable materials known in the art may also be utilized, if desired.

Generally, the temperatures employed for vacuum deposition should be sufficient to vaporize or sublime the material being vacuum deposited. The partial vacuum applied can vary within a wide range depending on the specific materials to be deposited. Typical applied vacuums range from between about $10^{-2}$ and about $10^{-6}$ torr. Thus, for example, chamber pressure during evaporation of selenium alloys may be on the order of about $4 \times 10^{-5}$ torr. Depending upon the specific material utilized and the type of vacuum applied, the typical coating temperatures employed are between about 200° C. and about 800° C. Evaporation is normally completed in about 15 to 25 minutes with a molten selenium alloy temperature ranging from about 250° C. to about 500° C. Other times and temperatures and pressures outside these ranges may be used as well understood by those skilled in the art. It is generally desirable that the substrate temperature be maintained in the range of from about 50° C. to about 70° C. during deposition of a selenium alloy layer. Additional details for the preparation of selenium layers are disclosed, for example, in U.S. Pat. Nos. 4,842,973 and 4,297,424, the entire disclosures of these patents being incorporated herein by reference. Evaporation of organic pigments by sublimation is typically accomplished at temperatures between about 400° C. and about 600° C. Deposition on a moving web is performed at rates of at least about 5 meters/minute to about 100 meters/minute with higher rates preferable for reasons of economy. The higher rates will, of course, require higher temperatures of evaporation. To ensure that the polymeric web substrate is not heated above its softening point, the web is wrapped on a cooling cylinder above the crucible. Additional details for the deposition of organic charge generation layers are disclosed, for example, in U.S. Pat. Nos. 4,555,463 and 4,587,189, the disclosures of these patents being incorporated herein in their entirety.

The substrate to be coated may be opaque or substantially transparent and may comprise numerous suitable materials having the required mechanical properties. The entire substrate may comprise a single layer material or it may comprise multiple layers. The surface of the substrate may be electrically insulating or electrically conductive. Any suitable electrically conductive material may be employed. Typical electrically conductive materials include, for example, aluminum, titanium, nickel, chromium, brass, stainless steel, copper, zinc, silver, tin, and the like. The electrically conductive material may vary in thickness over substantially wide ranges depending on the desired use. Accordingly, the conductive material may comprise a layer ranging in thickness, for example, from about 50 Angstrom units to many centimeters. Typical electrically insulating nonconducting substrate materials include polyesters, polycarbonates, polyamides, polyurethanes, and the like. The coated or uncoated substrate may be flexible or rigid and may have any number of configurations such as, for example, a plate, a cylindrical drum, a scroll, an endless flexible belt, and the like. For electrophotoconductive members, the outer surface of the supporting substrate preferably comprises a metal oxide such as aluminum oxide, nickel oxide, titanium oxide, and the like. If desired, conventional relative movement may be effected between the surface of the substrate to be coated and the crucible slot. Thus, for example, drum shaped substrates may be rotated adjacent a crucible slot to achieve vapor deposition of coating material around the entire circumference of the drum.

In some cases, intermediate adhesive layers between the substrate and subsequently applied layers may be desirable to improve adhesion. If such adhesive layers are utilized, they preferably have a dry thickness between about 0.1 micrometer to about 5 micrometers if utilized in an electrophotoconductive member. Typical adhesive layers include film-forming polymers such as polyester, polyvinylbutyral, polyvinylpyrolidone, polycarbonate, polyurethane, polymethylmethacrylate, and the like and mixtures thereof.

A principal advantage of this invention is that it enables operating conditions that minimize differential evaporation of a two component material, sometimes referred to as fractionation, and large particle ejection or spatter of the evaporant material. Another advantage is that inert material which is not suitable for resistance heating maybe used to hold the evaporant material. Still another advantage is that the vacuum evaporator containers of this invention may be easily cleaned with harsh materials such as acids or solvents without any adverse effects. Other advantages include ease of loading of the evaporant.

A number of examples are set forth hereinbelow and are illustrative of different compositions and conditions that can be utilized in practicing the invention. All proportions are by weight unless otherwise indicated. It will be apparent, however, that the invention can be practiced with many types of compositions and can have many different uses in accordance with the disclosure above and as pointed out hereinafter.

EXAMPLE I

A photoreceptor drum was coated using the vacuum evaporation container of this invention. An aluminum drum was mounted on rotatable shaft. The axis of the drum was positioned parallel to the axis of a cylindrical stainless steel crucible. The drum had a length of about 40 centimeters and a diameter of about 24 centimeters. The cylindrical crucible of stainless steel had a circular cross-section, an internal diameter of about 5 centimeters, a wall thickness of about 0.5 millimeter, a length of about 60 centimeters, and an axially aligned narrow slot along the top of the cylindrical crucible. The crucible slot had a width of about 5 millimeters and a slot length of about 45 centimeters. The drum was positioned so that its outer surface was about two centimeters from the crucible. A cylindrical insert machined from a carbon (graphite) rods (available from Pure Carbon Corp of Pennsylvania), having a circular cross-section, an external diameter of about 4.98 centimeters, a wall thickness of about 2.5 millimeters, and an axially aligned wide slot on the top of the cylindrical crucible was loaded with 190 grams of selenium-arsenic-iodine pellets. The insert slot had a width of about 15 millimeters and a length of 38 centimeters. The insert also had circular shaped ends, each end having a diameter of about 4.98 centimeters. The selenium-arsenic-iodine pellets were formed from beads prepared by water quenching droplets of a molten alloy comprising about 63.7 atomic percent selenium, about 36 atomic percent arsenic and about 0.3 atomic percent iodine, based on the total weight of the beads. Electrophotographic imaging members were prepared by vacuum evaporating the selenium-arsenic-iodine alloy pellets at a temperature of 385° C. to 410°C. with the aluminum drum substrate held at 180° C., at an evaporation pressure between about $4\times10^{-4}$ torr and $2\times10^{-5}$ torr. This resulted in a film 60 micrometers thick and 38 centimeters wide and comprising about 36.5 atomic percent arsenic, 0.37 atomic percent iodine and 73.1 atomic percent selenium. This composition was obtained by X-ray energy dispersion analysis based on the total weight of the final coating layer onto the aluminum substrates. A top surface analysis by means of an electron probe gave 37 atomic percent arsenic, indicating excellent uniformity.

EXAMPLE II

A polyester film supplied from a roll can be vacuum coated with an electrically conductive titanium layer so that the layer has a thickness of about 200 Angstroms. The exposed surface of the titanium layer should be oxidized by exposure to oxygen in the ambient atmosphere. A siloxane hole blocking layer can be formed on the oxidized titanium layer by applying a 0.22 percent (0.001 mole) solution of 3-aminopropyl triethoxylsilane with a gravure applicator. The deposited coating can be dried at 135° C. in a forced air oven to form a layer having a thickness of about 450 Angstroms. A coating of polyester resin (49000, available from the E. I. du Pont de Nemours & Co.) can next be applied with a gravure applicator to the siloxane coated base. The polyester resin coating can be dried to form a film having a thickness of about 0.05 micrometer. This coated film web about 45 centimeters wide can then be placed in a roll vacuum coater. The film can be moved across a crucible positioned about 10 centimeters from the top of a cylindrical stainless steel crucible. The cylindrical crucible can be identical to that described in Example I. A cylindrical insert fabricated from a quartz glass tube having a circular cross-section, an external diameter of about 4.98 centimeters, a wall thickness of about 2 millimeters, and an axially aligned wide slot on the top of the cylindrical crucible can next be loaded with about 50 grams of benzimidazole perylene pellets. The perylene can be formed by the condensation of perylene dianhidride with o-phenylene diamine as described in U.S. Pat. No. 4,587,189 and compacted into pellets about 13 millimeters in diameter and about 5 millimeters thick. The insert slot can have a width of about 40 millimeters and a length of about 40 centimeters. The insert can also have circular shaped ends enclosing the cylinder. Electrophotographic imaging members can be prepared by vacuum evaporating the pigment pellets to form a charge generator layer or film at a crucible temperature of about 550° C. and an evaporation pressure between about $4\times10^{-4}$ torr and $2\times10^{-5}$ torr. The speed of the web can be controlled to give a thickness of deposited film to be about 0.2 micrometers. A charge transport layer can then be formed on the charge generator layer by applying a solution of a polycarbonate resin and N,N'-diphenyl-N,N'-bis(3-methylphenyl)-[1,1'-biphenyl]-4,4'-diamine dissolved in methylene chloride to ultimately provide a 40 percent by weight loading of N,N'-diphenyl-N,N'-bis(3-methylphenyl)-[1,1'-biphenyl]-4,4'-diamine, respectively, in the transport layer after drying. Sufficient transport layer material can be coated on top of the generator layer so that after drying at temperature of about 135° C., a transport layer having thickness of about 24 micrometer is formed. An optional anti curl backing coating can be also applied.

Although the invention has been described with reference to specific preferred embodiments, it is not intended to be limited thereto, rather those skilled in the art will recognize that variations and modifications may be made therein which are within the spirit of the invention and within the scope of the claims.

What is claimed is:

1. A vacuum deposition process comprising providing a vacuum evaporation container comprising at least one resistively heatable conductive cylindrical crucible having at least one open end and having an axially aligned narrow slot, providing at least one hollow first cylindrical insert having an outside diameter smaller than the inside diameter of said cylindrical crucible, said first cylindrical insert having an axially aligned wide slot that is wider than the width of said narrow slot of said cylindrical crucible, closed ends and an electrical conductivity less than the electrical conductivity of said resistively heatable cylindrical crucible, loading particles of a first solid vaporizable material into said first cylindrical insert, sliding said first cylindrical insert into said open end of said evaporation container to concentrically position said first cylindrical insert within said cylindrical crucible and to align said wide slot of said first cylindrical insert with said narrow slot of said crucible, placing a first substrate to be coated adjacent to said vacuum evaporation container, said first substrate having an area to be coated that has a width substantially the same as the length of said narrow slot of said first cylindrical insert, heating said cylindrical crucible in a partial vacuum to vaporize said first vaporizable material, depositing said first vaporizable material as a coating on said first substrate as a solid coating, removing said first substrate, removing said first cylindrical insert from said crucible, sliding a second cylindrical insert containing a second solid vaporizable material into said crucible, said second cylindrical insert having a slot length different from the slot length of said first hollow cylindrical insert and a width wider than the width of said narrow slot of said cylindrical crucible, aligning said slot of said second hollow cylindrical insert with said narrow slot of said crucible, placing a second substrate to be coated adjacent to said vacuum evaporation container, said second substrate having an area to be coated that has a width substantially the same as the length of said slot of said second hollow cylindrical insert, heating said cylindrical crucible in a partial vacuum to vaporize said second vaporizable material, and depositing said material from said vapors onto said second substrate as a solid coating.

2. A vacuum deposition process comprising providing a vacuum evaporation container comprising at least one resistively heatable cylindrical crucible having at least one open end and having an axially aligned narrow slot, providing at least one hollow cylindrical insert having an outside diameter smaller than the inside diameter of said cylindrical crucible, said cylindrical insert having an axially aligned wide slot that is wider than the width of said narrow slot of said cylindrical crucible, closed ends and an electrical conductivity less than the electrical conductivity of said resistively heatable cylindrical crucible, loading particles of solid vaporizable material into said hollow cylindrical insert, sliding said cylindrical insert into said open end of said evaporation container to concentrically position said cylindrical insert within said cylindrical crucible and to align said wide slot of said cylindrical insert with said narrow slot of said crucible, placing a substrate to be coated adjacent to said vacuum evaporation container, and heating said cylindrical crucible in a partial vacuum to vaporize said vaporizable material to form vapors in said cylindrical insert and depositing said material from said vapors onto said substrate as a solid coating.

3. A vacuum deposition process according to claim 2 including loading a plurality of cylindrical inserts with said solid vaporizable material and sliding said cylindrical inserts end to end into said open end of said cylindrical crucible prior to said heating.

4. A vacuum deposition process according to claim 2 wherein the external cross-sectional shape of said insert has the same general shape as the cross-sectional shape of said crucible.

5. A vacuum deposition process according to claim 2 including removing said insert from said open end, inserting solid particles of vaporizable material into said hollow cylindrical insert, and sliding said insert containing said solid vaporizable material into said open end prior to heating said cylindrical crucible in a partial vacuum to vaporize said vaporizable material.

6. A vacuum deposition process according to claim 5 including inserting fresh solid particles of vaporizable material into a second hollow cylindrical insert while said first insert containing said solid vaporizable material is heated in said partial vacuum to vaporize said vaporizable material.

7. A vacuum deposition process according to claim 2 including heating said cylindrical crucible by passing an electric current through said crucible from one end to the other.

8. A vacuum deposition process according to claim 7 wherein the bulk resistivity of said electrically conductive cylindrical crucible is between about $10^{-2}$ ohms and about $10^3$ ohms and said insert is sufficiently electrically insulating whereby less than about 1 percent of said electrical current flowing from one end of said crucible to the other passes through said insert during passage of said electric current through said crucible.

9. A vacuum deposition process according to claim 2 wherein the width of said narrow slot of said crucible is smaller than the largest particle size of said solid particles of vaporizable material and the width of said wide slot of said insert is larger than the largest particle size of said solid particles of vaporizable material.

10. A vacuum deposition process according to claim 2 including directing said vapors in an indirect path from said solid particles of vaporizable material through said wide slot of said cylindrical insert to said substrate.

11. A vacuum deposition process according to claim 2 wherein said vaporizable material is an inorganic material.

12. A vacuum deposition process according to claim 11 wherein said vaporizable material inorganic material is an alloy of selenium.

13. A vacuum deposition process according to claim 2 wherein said vaporizable material material is an organic material.

14. A vacuum deposition process according to claim 2 wherein said wide slot has a width of between about 2.5 centimeters and about 25 centimeters and said narrow slot has a width of less than about 10 millimeters.

* * * * *